United States Patent
Teppe et al.

(10) Patent No.: US 10,115,851 B2
(45) Date of Patent: Oct. 30, 2018

(54) SOLAR CELL HAVING A DIELECTRIC REAR FACE COATING AND METHOD FOR PRODUCING SAME

(75) Inventors: Andreas Teppe, Constance (DE); Adolf Muenzer, Unterschleissheim (DE); Jan Schoene, Reichenau (DE); Mathias Hein, Constance (DE); Peter Winter, Reichenau (DE)

(73) Assignees: Centrotherm Photovoltaics AG, Blaubeuren (DE); RCT Solutions GMBH, Constance (DE)

( * ) Notice: Subject to any disclaimer, the term of this patent is extended or adjusted under 35 U.S.C. 154(b) by 150 days.

(21) Appl. No.: 13/879,593

(22) PCT Filed: Oct. 14, 2011

(86) PCT No.: PCT/DE2011/075252
§ 371 (c)(1),
(2), (4) Date: Aug. 9, 2013

(87) PCT Pub. No.: WO2012/083938
PCT Pub. Date: Jun. 28, 2012

(65) Prior Publication Data
US 2013/0312823 A1   Nov. 28, 2013

(30) Foreign Application Priority Data
Oct. 15, 2010   (DE) .................. 10 2010 048 437

(51) Int. Cl.
| H01L 31/052 | (2014.01) |
| H01L 31/0224 | (2006.01) |
| H01L 31/18 | (2006.01) |
| H01L 31/056 | (2014.01) |

(52) U.S. Cl.
CPC .. *H01L 31/0527* (2013.01); *H01L 31/022425* (2013.01); *H01L 31/056* (2014.12); *H01L 31/18* (2013.01); *H01L 31/1804* (2013.01); *Y02E 10/547* (2013.01); *Y02P 70/521* (2015.11)

(58) Field of Classification Search
CPC ............. H01L 31/022425; H01L 31/18; H01L 31/1804; H01L 31/056; H01L 31/0527
See application file for complete search history.

(56) References Cited

U.S. PATENT DOCUMENTS

| 4,158,591 A | | 6/1979 | Avery et al. |
| 4,694,115 A | * | 9/1987 | Lillington et al. ............ 136/256 |
| 6,117,266 A | | 9/2000 | Horzel et al. |

(Continued)

FOREIGN PATENT DOCUMENTS

| DE | 3336700.0 A1 | 4/1985 |
| DE | 102010025983.7 A1 | 9/2011 |
| EP | 1763086 A1 | 3/2007 |

OTHER PUBLICATIONS

International Search Report for PCT/DE2011/075252, dated Aug. 28, 2012.

*Primary Examiner* — Golam Mowla
(74) *Attorney, Agent, or Firm* — Hunter Clark PLLC

(57) ABSTRACT

Solar cell (11; 21; 31) having a dielectric coating arranged on a back side of the solar cell (11; 21; 31) which is at least partly covered by at least one planar contact (12; 22; 32), a boundary line (14; 24; 34) of the at least one planar contact (12; 22; 32) having at least one recess (16a, 16b; 26a, 26b, 26c), and method for producing same.

12 Claims, 3 Drawing Sheets

(56) References Cited

U.S. PATENT DOCUMENTS

Figure 1:
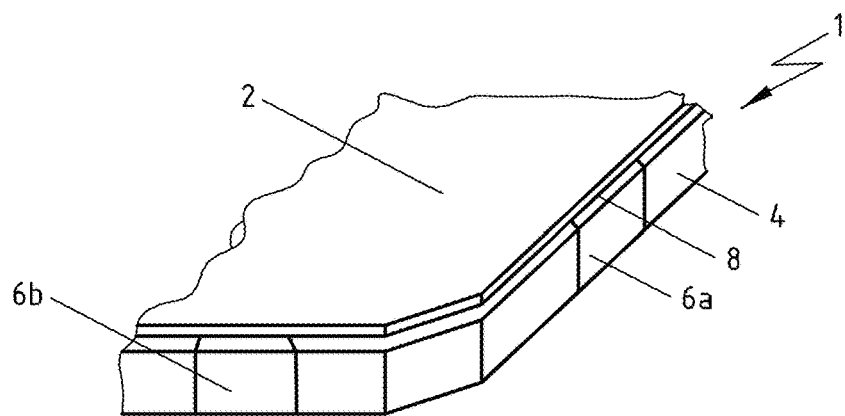

| | | |
|---|---|---|
| 6,251,756 B1 | 6/2001 | Horzel et al. |
| 2009/0061627 A1 | 3/2009 | Trassl et al. |
| 2009/0139570 A1* | 6/2009 | Kinoshita ......... H01L 31/03762 |
| | | 136/256 |
| 2009/0211628 A1 | 8/2009 | Engelhart et al. |
| 2009/0301557 A1 | 12/2009 | Agostinelli et al. |
| 2009/0320922 A1* | 12/2009 | Hacke ............. H01L 31/022458 |
| | | 136/256 |

* cited by examiner (State of the art)

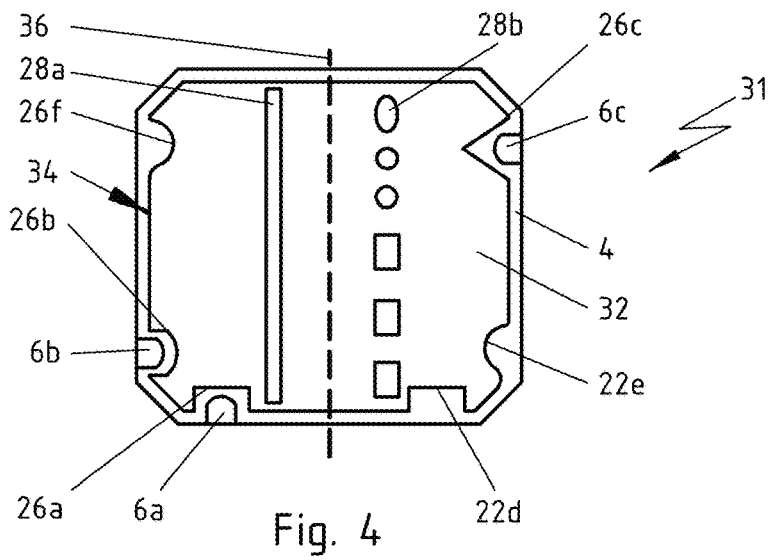
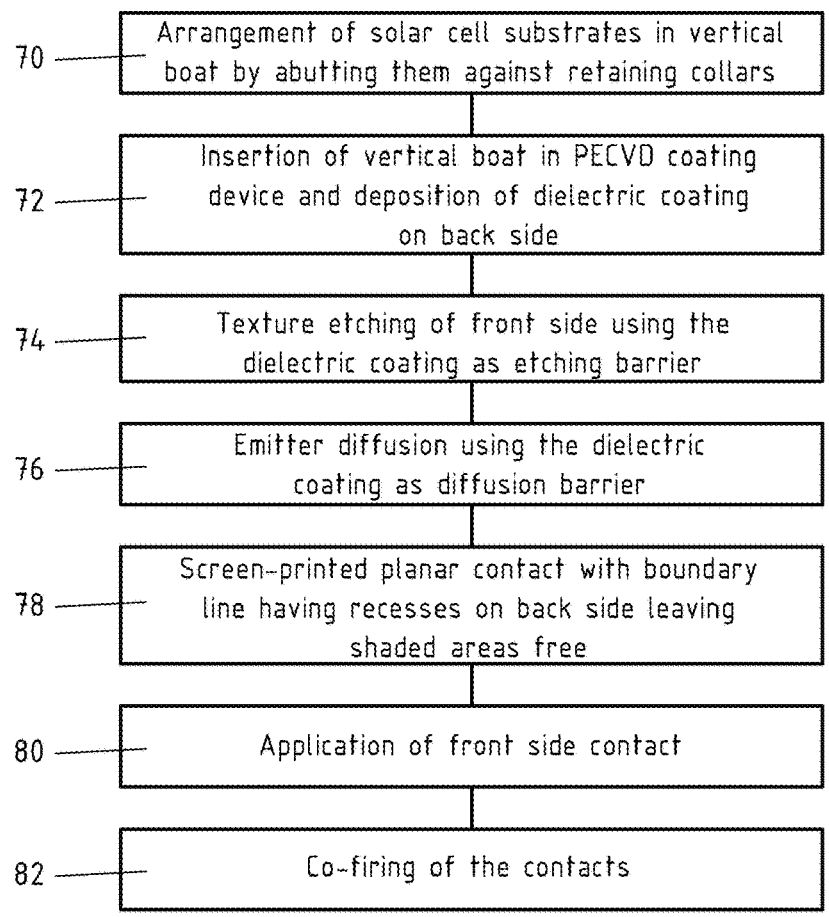
Fig. 5

(State of the art)

SOLAR CELL HAVING A DIELECTRIC REAR FACE COATING AND METHOD FOR PRODUCING SAME

The invention relates to a solar cell and a method for producing a solar cell.

In solar cells produced in accordance with the current state of development, dielectric coatings are often provided on the back side of the solar cell, i.e. the side turned away from the incident light in operating condition, as optical mirrors for long-wave light components. The most advanced production methods apply the dielectric coating even before an emitter diffusion on a solar cell substrate used for the production of the solar cell and it is then used as a diffusion barrier against any diffusion of emitter dopant into the back side of the solar cell substrate. Also, the dielectric coating can be applied before any texture etching of a front side, i.e. a side of the solar cell substrate facing the incident light in operating condition, and used as etching barrier to counter any etching of the back side of the solar cell substrate. Such advantageous production methods are described in German patent application no. 10 2010 025 983.7.

Dielectric coatings are usually applied using the chemical vapour deposition (CVD) method, in particular by means of plasma-enhanced chemical vapour deposition (PECVD) methods. In this case, the solar cell substrates are arranged in retaining devices known as boats, which are placed in a coating device in order to apply the coating to the solar cell substrate. The solar cell substrates are often arranged essentially vertically in the boats, i.e. their back side planes extend essentially in the vertical axis. Boats of this type are therefore referred to as vertical boats. In order to deposit the dielectric coating as fully as possible on the entire back side of the solar cell substrate, the vertical boats are provided with retaining collars, known as retaining pins, on which the solar cell substrates are brought to abut with their front side facing towards a plate extending essentially vertically. These retaining collars usually consist of ceramic or graphite rods.

It has now emerged that there can be local short circuits in the finished solar cell in the area around the retaining collars, which impair the cell's efficiency. It was found that this was due to shading effects of the retaining collars, which could cause the dielectric coating to turn out thinner in areas around the retaining collars than in other parts of the dielectric coating. If there is a subsequent emitter diffusion, the result of this can be that dopant in the areas around the retaining collars can pass locally through the thin dielectric coating into the back side of the solar cell substrate. In connection with a contact placed on the back side of the solar cell substrate, this can lead to said local short circuits. This risk increases if, before the emitter diffusion, the dielectric coating is used as an etching barrier, for example in the aforementioned texture etching. This is because, in etching steps of this nature, the dielectric coating may be attacked and further thinned out by the etching medium used.

The problem described can be avoided by arranging the solar cell substrates in horizontal instead of vertical boats, since in these the solar cell substrates are laid on plates and this means that retaining collars are no longer required. As it turned out, however, only half as many solar cell substrates can be coated in a horizontal boat as in a comparable vertical boat. The use of horizontal boats is therefore accompanied by a significant increase in production costs.

Another way to avoid the problem described lies in placing the solar cell substrates in coating devices with an indirect plasma. However, it has turned out that the dielectric coatings applied in such coating devices are less thick than coatings produced in coating devices with a direct plasma. Because they are less thick, the dielectric layers produced using indirect plasma are less suitable as diffusion- or etching barriers. This impairs their usability in the modern solar cell production methods described above.

The problem described can also be avoided by applying a contact of reduced breadth and reduced height on the back side of the solar cell substrate. As it has turned out, however, the breadth and height of the contact must be reduced comparatively severely in order to reliably prevent any contacting of shaded areas. The associated significantly reduced contact area, however, also leads to losses in efficiency due to increased resistance losses.

In this context, the present invention is based on the problem of providing a solar cell with dielectric coating on its back side and improved efficiency, which at the same time can be produced economically.

This problem is solved by a solar cell with the features of claim 8.

Advantageous refinements are the subject-matter of the dependent sub claims.

The invention is also based on the problem of providing a method by means of which solar cells can be produced economically with a dielectric coating on their back side and improved efficiency.

This problem is solved by a method with the features of claim 1.

Advantageous refinements are, again, the subject-matter of the dependent sub claims.

The solar cell according to the invention has a dielectric coating arranged on a back side of the solar cell. This can be, for example, an oxide-nitride coating. The dielectric coating is covered, at least partly, by at least one planar contact. A boundary line of the at least one planar contact has at least one recess.

In this way, in the areas kept clear by the at least one recess from the at least one planar contact, those areas of the solar cell substrate can be arranged which were shaded by retaining collars during the deposition of the dielectric coating. Local short circuits in these areas can thus be prevented. Also, the total area of the planar contact is only slightly reduced by the at least one recess, so that an improvement in the efficiency of the solar cell is possible.

In the context of this invention, the back side of a solar cell means a large-area side of the solar cell facing away from the incident light when the solar cell is in operating condition. Large-area sides are the back and the front of the solar cell, which are differentiated from small-area edges of the solar cell. A contact in this same context refers to a metallic coating by means of which the solar cell can be electrically contacted.

Advantageously, the dielectric coating has a thickness, at least partly, in an area of the back side of the solar cell kept clear by the at least one recess of the planar contact, of less than 50%, preferably of less than 30% and especially preferably of less than 10% of its maximum thickness. This enables an effective improvement in efficiency by effectively preventing local short circuits.

In another variant embodiment, an area of the back side of the solar cell kept free of the planar contact by the at least one recess is at least partly free from the dielectric coating. The dielectric coating is thus completely absent in at least some of the area of the back side kept free by the at least one recess of the planar contact. This variant has proven effective, especially in connection with the use of the dielectric coating as etching barrier during a texture etching of the front side of the solar cell.

Since in vertical boats, as a rule, two to three retaining collars are provided, the boundary line preferably has two, especially preferably three, recesses. These are arranged in such a way that they keep the areas of the planar contact shaded by the retaining collars during the deposition of the dielectric coating clear. A larger number of recesses can be provided if necessary.

Advantageously the boundary line has several recesses which are arranged mirror-symmetrically to a straight line running in one plane of the planar contact. In vertical boats, it can be advantageous to arrange the retaining collars partially in mirror image, for example if the retaining collars pass through an essentially vertical plate of the vertical boat and are used on both sides of the plate as retaining collars. As a result of the mirror-symmetrical arrangement of the recesses as described, the areas shaded by the retaining collars during the deposition of the dielectric coating can be arranged in recesses of a solar cell, arranged one on one side of the plate of the vertical boat and one on the other side of the plate. Accordingly, a total of preferably four, especially preferably six, recesses is provided.

In practice, a planar contact applied using a printing process of prior art has proven effective, in particular a contact applied using screen printing. For example, the planar contact can be formed by screen-printed aluminium-based pastes.

Preferably, the solar cell is designed as a silicon solar cell. This can be either a monocrystalline or a multicrystalline silicon solar cell.

The method according to the invention makes provision that a solar cell substrate is arranged in a retaining device by bringing the solar cell substrate to abut against retaining collars. Thereafter, the retaining device is placed in a coating device and a dielectric coating, for example an oxide-nitride coating, is deposited onto the back side of the solar cell substrate. Next, a planar contact is applied at least on parts of the dielectric coating. In this application of the planar contact on at least part of the dielectric coating, those areas which have been shaded by the retaining collars during the deposition of the dielectric coating are left free. Therefore, no planar contact is applied on the areas which have been shaded during the deposition of the dielectric coating.

In the present context, shaded areas means areas in which deposition of the dielectric coating is prevented by retaining collars or other shading objects in such a way that the thickness of the deposited dielectric coating is reduced or there is no dielectric coating present at all.

Using the method according to the invention, the formation of local short circuits in shaded areas is economically prevented and the efficiency of the finished solar cell is improved as a result. The solar cell according to the invention can be produced using the method according to the invention.

Advantageously a vertical boat is used as retaining device. In this case, a vertical boat means a retaining device in which the solar cell substrates are arranged essentially vertically, i.e. the back sides of the solar cell substrates, to be more precise the planes defined by the back sides, extend essentially in the vertical axis. Or in other words: The normal vectors of planes formed by back side surfaces of the solar cell substrates extend essentially in the horizontal axis, whereby the expression "essentially" is intended to include an angular deviation from the horizontal axis of up to 10°. More solar cell substrates can be arranged in vertical boats than in other retaining devices, which has an advantageous effect on the expense required to produce the solar cells.

Preferably, a planar contact is applied whose boundary line has at least one recess. Also, the planar contact is designed and arranged in such a way that the at least one recess leaves at least part of those areas which have been shaded by the retaining collars during the deposition of the dielectric coating free from being covered by the planar contact. This enables local short circuits to be prevented with a slight reduction in the contact area, which has a positive effect on the efficiency of the solar cell. Preferably these areas are completely left free from being covered by the planar contact.

In principle, several planar contacts of this type can be applied side by side, which together advantageously leave all areas which were shaded by the retaining collars during the deposition of the dielectric coating free from being covered by planar contacts.

Especially preferably, however, a planar contact is applied whose boundary line has a recess for each of the areas shaded during the deposition of the dielectric coating by retaining collars. Each of these recesses is designed and arranged in such a way that it leaves free from a covering with the planar contact that area which was shaded by the associated retaining collar during the deposition of the dielectric coating. Advantageously these areas are left completely free from being covered by the planar contact.

It has proven effective to print the planar contact onto the dielectric coating, or parts thereof, using printing processes of prior art. In particular, screen printing processes can be used for this, which can be adapted easily and cheaply to varying contact geometries and forms of the boundary line of the planar contact.

Preferably the dielectric coating is deposited by means of a plasma-enhanced chemical deposition from the vapour phase (PECVD) onto the back side of the solar cell substrate, using a direct plasma. As mentioned at the beginning, in this way a thicker dielectric coating can be produced than with indirect plasmas, which has an advantageous effect on the use of the dielectric coating as diffusion- and/or etching barrier.

After the deposition of the dielectric coating an emitter diffusion can be conducted in order to form an emitter on one front side of the solar cell substrate and the dielectric coating can be used during the emitter diffusion as a diffusion barrier against any diffusion of dopant into the back side of the solar cell substrate. This enables an economical one-sided emitter diffusion from the gas phase.

Advantageously the solar cell substrate is etched in a texture etching medium after the deposition of the dielectric coating, in order to form a texture on the front side of the solar cell substrate. During the etching, the dielectric coating is used as an etching barrier against any etching of the back side of the solar cell substrate.

Preferably a silicon substrate is used as solar cell substrate.

Insofar as, instead of a planar contact, a contact network consisting of several intersecting contact lines or contact strips is to be used, the problem on which the invention is based can be solved if, in the surroundings of those areas which have been shaded by the retaining collars during the deposition of the dielectric coating, contact lines or contact strips are designed to be shortened in such a way that the areas shaded by the retaining collars during the deposition of the dielectric coating are free from contact lines and contact strips. Therefore there is neither a contact line nor a contact strip running over these areas. Local short circuits can thus be prevented. A solar cell formed in this way would therefore have shortened contact lines or strips in these areas. Preferably contact lines and strips are shortened in such a way that they are at a distance of at least 1 mm from shaded areas.

There is also the possibility of tackling the problem on which the invention is based by designing a conventional planar contact as described at the beginning with reduced height and breadth, but the planar contact is also brought closer to those edges at which no areas shaded by the retaining collars exist during the deposition of the dielectric coating. In this way, the loss of contact area associated with the reduction in height and breadth is reduced and the resultant loss of efficiency is lessened. However, there are higher requirements on the orientation of the solar cell substrate during the production process. Solar cells produced in this way thus have a planar contact which is not symmetrical with respect to the edges of the solar cell on it back side, which lies very close to two edges of the solar cell and is further away from the other two edges.

Figure 2:
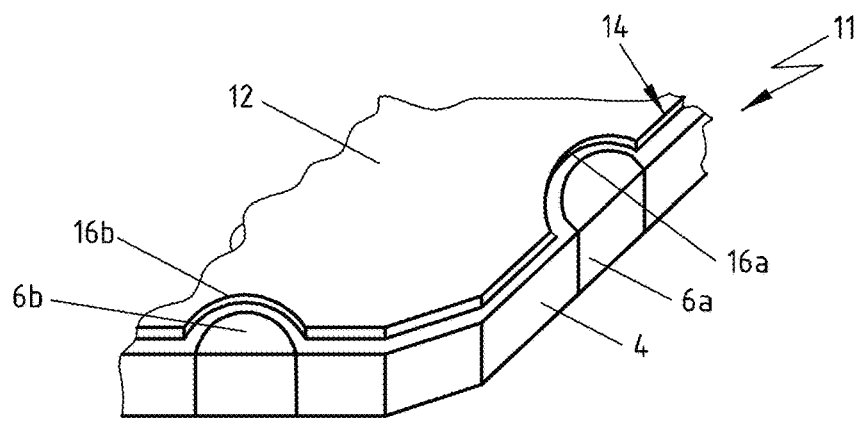
Figure 3:
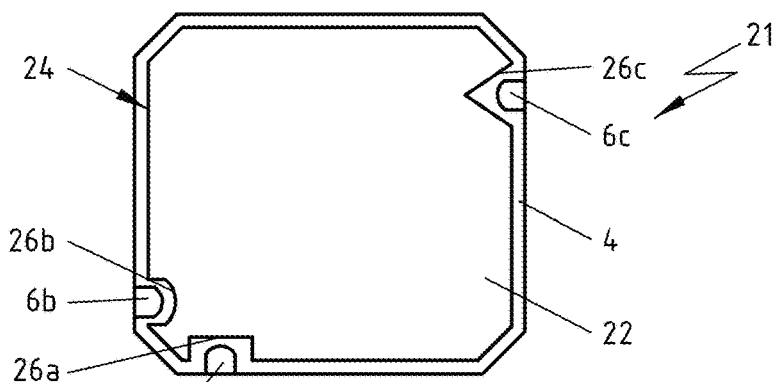
Figure 6:
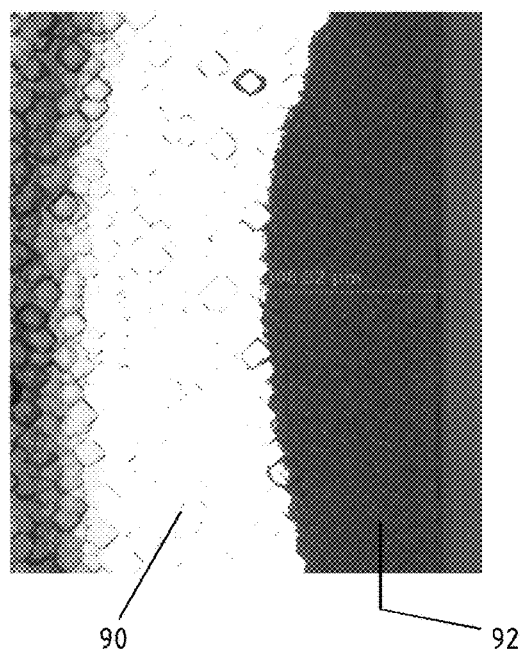
Figure 7:
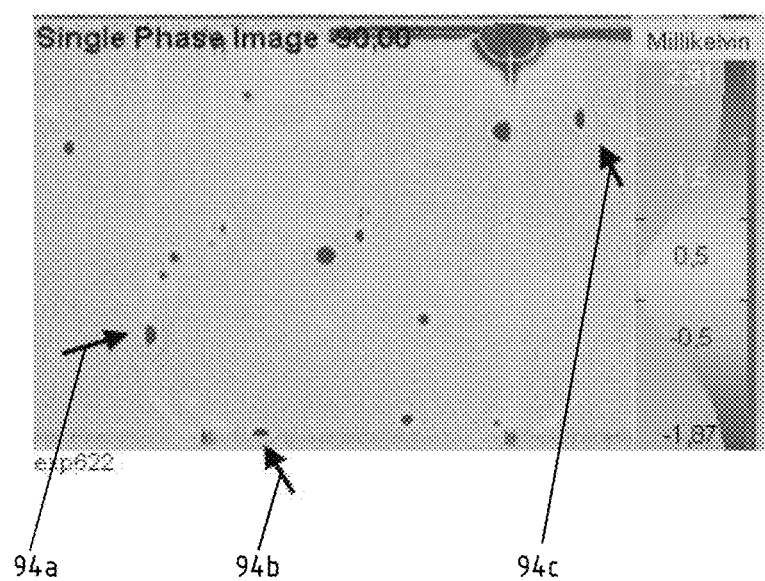

Next, the invention will be explained in more detail on the basis of the figures. Where useful, elements with the same action are accompanied by the same reference numbers. The figures show:

FIG. 1 Schematic partial view of a solar cell back side according to the state of the art in perspective view FIG. 2 Schematic partial view of a first embodiment of the solar cell according to the invention in perspective view FIG. 3 Rear view of a second embodiment of the solar cell according to the invention in a schematic view FIG. 4 Rear view of a third embodiment of the solar cell according to the invention in a schematic view FIG. 5 Schematic diagram of an embodiment of the method according to the invention FIG. 6 Microscopic image of an area of a back side of a solar cell substrate shaded during the deposition of a dielectric coating FIG. 7 Thermographic image of a solar cell according to the state of the art FIG. 1 shows in schematic view a perspective view of a back side of a solar cell 1 according to the state of the art. A dielectric coating 4, for example an oxide-nitride coating, is arranged on the back side of the solar cell 1. This also partially covers edges of the solar cell 11. On the back side of the solar cell 1 a planar contact 2 is also provided, which partially covers the dielectric coating 4. The planar contact 2 thereby also covers areas 6a, 6b, which had been shaded by retaining collars during deposition of the dielectric coating 4. These are shown in white in FIG. 1. The shaded areas 6a, 6b extend from the edges of the solar cell 1 to the back side of the solar cell 1 and are not covered, or only covered by a considerably thinner dielectric layer than the other areas of the back side of the solar cell which are covered by the dielectric coating 4. Since emitter dopant has been diffused into the solar cell 1 in the shaded areas 6a, 6b in the course of an emitter diffusion conducted following the application of the dielectric coating 4, local short circuits 8 arise in the shaded areas 6a, 6b due to the contacting of the shaded areas 6a, 6b by the planar contact 2.

The fact that such local short circuits pose a considerable problem for the solar cell is illustrated by FIGS. 6 and 7. FIG. 6 shows a microscopic view of a back side of a solar cell substrate shaded during deposition of a dielectric coating. On the right side of the image an area 92 of the back side of the solar cell substrate not covered by parts of the dielectric coating appears in black. This area 92 without dielectric coating is adjoined on its left side by a dielectric coating 90, which appears pale in the microscopic image. The discolouration appearing on the left of the pale area comes about because the dielectric coating 90 becomes thicker as its distance from the retaining collar increases, until no more shading effects exist and a maximum thickness has been reached. FIG. 6 thus illustrates that retaining collars, by shading, can effect a locally reduced deposition of the dielectric coating. Sometimes they can even completely prevent deposition of the dielectric layer locally.

It can be seen from FIG. 7 that the resultant short circuits reach a relevant degree. The figure shows a thermographic image of a solar cell. Short circuits can be seen here as dark spots. The local short circuits marked by arrows 94a, 94b, 94c are clearly, due to their position, attributable to the areas shaded during deposition of the dielectric coating. As FIG. 7 shows, these local short circuits are massive short circuits, which have a negative effect on the efficiency of the solar cell.

FIG. 2 shows in perspective view a schematic partial view of a first embodiment of the solar cell according to the invention. This is designed as a silicon solar cell 11, on the back side of which a dielectric coating 4, for example a PECVD-oxide-nitride coating, is arranged. This is partially covered by a planar contact 12. The planar contact 12 has a boundary line 14, which in the perspective view in FIG. 2 follows the course of the edge of the planar contacts and has recesses 16a, 16b. The shaded areas 6a, 6b are kept free of the planar contact 12 by the recesses 16a, 16b, so that no local short circuits occur. In one variant embodiment, there can be a dielectric coating in the shaded areas 6a, 6b with a thickness which is less than 50%, preferably less than 30% and especially preferably less than 10%, of the maximum thickness of the dielectric coating 4. In another variant embodiment the shaded areas 6a, 6b may be completed free from any dielectric coating.

FIG. 3 shows a rear view of a second embodiment of the solar cell according to the invention in schematic view. This is again a silicon solar cell 21, on the back side of which a dielectric coating 4 is arranged. This is partially covered by a planar contact 22, whose boundary line 24 has three recesses 26a, 26b, 26c. The areas 6a, 6b, 6c shaded during the deposition of the dielectric coating 4 are kept free from the planar contact 22 by the recesses 26a, 26b, 26c. As in the case in FIG. 2, there may be a dielectric coating of reduced thickness or no dielectric coating at all in the shaded area.

As FIG. 3 illustrates, the recesses 26a, 26b, 26c can be shaped in various ways. This enables them to be adapted to the requirements of the respective manufacturing process.

FIG. 4 shows a third embodiment of the solar cell according to the invention in a schematic rear view. This is again a silicon solar cell 31. This differs from the silicon solar cell 21 from FIG. 3 firstly in that it has a planar contact 32, whose boundary line 34 has six recesses 26a, 26b, 26c, 26d, 26e, 26f instead of three recesses. These recesses 26a, 26b, 26c, 26d, 26e, 26f are arranged mirror-symmetrically to a mirror line 36, shown dashed in FIG. 4, which runs in the same plane as the planar contact 32. In this way, the planar contact 32, as described in more detail above, can also be used for solar cells, and/or solar cell substrates in which the shaded areas are arranged laterally transposed.

As FIG. 4 illustrates, it is not strictly necessary for the recesses 26a, 26b, 26c, 26d, 26e, 26f to be configured mirror-symmetrically to the mirror plane 36. So for example the recess 26f has a different design than the recess 26c arranged mirror-symmetrically to it. A mirror-symmetrical arrangement is adequate in principle.

The silicon solar cell 34 from FIG. 4 also differs from the one in FIG. 3 in that there are solder contacts 28a, 28b arranged on the planar contact 34. These can for example be formed by silver-based screen printed contacts and are used for connecting the solar cell in a solar cell module. As can be seen from FIG. 4, the solder contacts can be designed as continuous solder contact 28a or as discontinuous solder contact 28b, whereby individual solder contact components of the discontinuous solder contacts 28b can in principle have different geometric forms. These should be adapted to the requirements of the individual case.

In the embodiments from FIGS. 2 to 4 the planar contact is applied using screen printing. The dielectric coating 4 is a PECVD-oxide-nitride coating. In principle, different coatings and printing processes are also possible.

The schematic diagram from FIG. 5 illustrates an embodiment of the method according to the invention. In this case, the solar cell substrate is firstly arranged in a vertical boat 70, by being laid against retaining collars. Next, the vertical boat is placed 72 in a PECVD-coating device and a dielectric coating is deposited 72 onto a back side of the solar cell substrate using a direct plasma. Preferably an oxide-nitride coating is deposited as dielectric coating. This is followed by a texture etching 74 of a front side of the solar cell substrate. The dielectric coating serves as an etching barrier against a texture etching medium used, so that the back side of the solar cell substrate is not texturized. This is followed by an emitter diffusion 76, in which the dielectric coating is used on the back side of the solar cell substrate as diffusion barrier against diffusion of emitter dopant into the back side of the solar cell substrate. Next, using a screen printing process, a planar contact having a boundary line with recesses is printed onto the back side of the solar cell substrate 78. These recesses are configured and arranged in such a way that all areas which have been shaded by the retaining collars during the deposition 72 of the dielectric coating are kept free from being covered by the planar contact 78. After this, in a method of prior art, a front side contact is applied to the front side of the solar cell substrate 80. In the embodiment from FIG. 5 this is done by screen printing the front side contact. After this the planar contact and the front side contact are co-fired 82 and in this way ohmic contacts are formed with the front and/or back side of the solar cell substrate. The contacts can in this case be fired through any anti-reflection coatings.

Additional process steps can easily be integrated into the process sequence shown in FIG. 5, for example those necessary to form a selective emitter structure. Conversely, the process sequence from the embodiment shown in FIG. 5 can be integrated easily into other manufacturing processes, for example into the solar cell manufacturing process described in the German patent application no. 10 2010 025 983.7. In that case it is not necessary for the individual process steps from the embodiment in FIG. 5 to be immediately consecutive.

LIST OF REFERENCE NUMBERS 1 solar cell
2 planar contact
4 dielectric coating
6a shaded area
6b shaded area
6c shaded area
8 electrical short circuit
11 silicon solar cell
12 planar contact
14 boundary line
16a recess
16b recess
21 silicon solar cell
22 planar contact
24 boundary line
26a recess
26b recess
26c recess
26d recess
26e recess
26f recess
28a solder contact
28b solder contact
31 silicon solar cell
32 planar contact
34 boundary line
36 mirror line
70 arrangement of solar cell substrates in vertical boat
72 loading of vertical boat in coating device and deposition of dielectric coating
74 texture etching
76 emitter diffusion
78 screen-printed planar contact on back side
80 application of front side contact
82 co-firing
90 dielectric coating
92 shaded area without dielectric coating
94a short circuit
94b short circuit
94c short circuit

The invention claimed is:

1. A method for production of a solar cell, comprising:
arranging a solar cell substrate in a retaining device having at least one retaining collar, being brought to abut against the at least one retaining collar;
inserting the retaining device into a coating device and depositing a dielectric coating on the back side of the solar cell substrate;
applying a planar contact on at least parts of the dielectric coating;
when the planar contact is applied on at least some parts of the dielectric coating, leaving free those areas which have been shaded by the retaining collars during the deposition of the dielectric coating;
configuring the planar contact in such a way that its boundary line has at least one recess; and
configuring and arranging the planar contact in such a way that the at least one recess leaves at least part of those areas which have been shaded by the retaining collars during the deposition of the dielectric coating free from a covering with the planar contact.

2. The method according to claim 1, characterised in that a vertical boat is used as the retaining device.

3. The method according to claim 1, characterised in that a recess is provided for each area shaded by retaining collars during the deposition of the dielectric coating, and each of these recesses is configured and arranged in such a way that it leaves that area which, during the deposition of the dielectric coating, was shaded by the associated retaining collar, at least partly free from being covered by the planar contact.

4. The method according to claim 1, characterised in that the planar contact is printed on.

5. The method according to claim 1, characterised in that the dielectric coating is deposited by means of a plasma-enhanced deposition from the vapour phase on the back side of the solar cell substrate, a direct plasma being used.

6. The method according to claim 1, characterised in that following the deposition of the dielectric coating an emitter diffusion is conducted to form an emitter on a front side of the solar cell substrate and the dielectric coating is used during the emitter diffusion as diffusion barrier against any diffusion of dopant into the back side of the solar cell substrate.

7. The method according to claim 1, characterised in that following the deposition of the dielectric coating the solar cell substrate is etched in a texture etching medium, in order to form a texture on the front side of the solar cell substrate, and the dielectric coating is used during the etching as etching barrier against any etching of the back side of the solar cell substrate.

8. A solar cell having a dielectric coating arranged on a back side of the solar cell which is covered at least partly by at least one planar contact, while a boundary line of the at least one planar contact has at least one recess, the solar cell characterised in that, in an area of the back side kept free from the planar contact by the at least one recess, the dielectric coating at least in some sections has a thickness of less than 50% of its maximum thickness and greater than zero, wherein the back side of the solar cell is a large area side of the solar cell facing away from incident light during operation of the solar cell.

9. The solar cell according to claim 8, characterised in that an area of the back side kept free from the planar contact by the at least one recess at least in some sections is free from the dielectric coating.

10. The solar cell according to claim 8, characterised in that the boundary line has two recesses.

11. The solar cell according to claim 8, characterised in that the boundary line has several recesses and the recesses are arranged mirror-symmetrically to a straight line running in one plane of the planar contact.

12. The solar cell according to claim 8, characterised in that the planar contact is applied using screen printing.

* * * * *